United States Patent
Hosoe et al.

(10) Patent No.: US 8,597,487 B2
(45) Date of Patent: Dec. 3, 2013

(54) METHOD OF PRODUCING ALUMINUM STRUCTURE AND ALUMINUM STUCTURE

(75) Inventors: Akihisa Hosoe, Osaka (JP); Kotaro Kimura, Osaka (JP); Takayasu Sugihara, Osaka (JP); Osamu Ohama, Osaka (JP); Kazuki Okuno, Itami (JP); Tomoyuki Awazu, Itami (JP); Koji Nitta, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 3 days.

(21) Appl. No.: 13/363,707

(22) Filed: Feb. 1, 2012

(65) Prior Publication Data

US 2012/0183436 A1    Jul. 19, 2012

Related U.S. Application Data (63) Continuation of application No. PCT/JP2011/070465, filed on Sep. 8, 2011.

(30) Foreign Application Priority Data

Sep. 20, 2010   (JP) .................................. 2010-210291

(51) Int. Cl.
*C23C 16/00*   (2006.01)
*C25D 9/02*    (2006.01)

(52) U.S. Cl.
USPC ............ 205/161; 205/166; 427/244; 427/593

(58) Field of Classification Search
USPC ............ 205/161, 166, 75; 427/244, 593, 247, 427/226; 75/415
See application file for complete search history.

(56) References Cited

FOREIGN PATENT DOCUMENTS

| JP | 06-010077 A | * 1/1994 |
|---|---|---|
| JP | 6-349481 | 12/1994 |
| JP | 8-170126 | 7/1996 |
| JP | 3413662 | 4/2003 |
| JP | 2003-142109 | 5/2003 |
| JP | 2005-285629 | 10/2005 |
| JP | 4176975 | 8/2008 |

OTHER PUBLICATIONS

Masaru Yao et al., "Long cycle-life $LiFePO_4$/Cu-Sn lithium ion battery using foam-type three-dimensional current collector," Journal of Power Sources, 2010, 195, pp. 2077-2081.

(Continued)

*Primary Examiner* — Roy King
*Assistant Examiner* — Janelle Morillo
(74) *Attorney, Agent, or Firm* — Drinker Biddle & Reath LLP (57) ABSTRACT

Provided is a method of producing an aluminum structure using a porous resin molded body having a three-dimensional network structure, with which it is possible to form an aluminum structure having a low oxide content in the surface of aluminum (i.e., having an oxide film with a small thickness), and in particular, it is possible to obtain an aluminum porous body that has a large area. The method includes a step of preparing an aluminum-coated resin molded body in which an aluminum layer is formed, directly or with another layer therebetween, on a surface of a resin molded body composed of urethane, and a step of decomposing the resin molded body by bringing the aluminum-coated resin molded body into contact with concentrated nitric acid with a concentration of 62% or more.

7 Claims, 6 Drawing Sheets

(56) References Cited

OTHER PUBLICATIONS

Masaru Yao et al., "LiFePO$_4$-based electrode using micro-porous current collector for high power lithium ion battery," Journal of Power Sources, 2007, 173, pp. 545-549.

Kazuki Okuno et al., "High-Rate Discharge Properties of Ni-MH Battery Using New Substrates for HEV Applications," SEI Technical Review, Jun. 2006, No. 62, pp. 29-33.

Kentaro Kuratani et al., "Converting rice husk activated carbon into active material for capacitor using three-dimensional porous current collector," Journal of Power Sources, 2011, 196, pp. 10788-10790.

* cited by examiner

METHOD OF PRODUCING ALUMINUM STRUCTURE AND ALUMINUM STUCTURE

CROSS REFERENCES TO RELATED APPLICATIONS

This is a continuation application of International Application No. PCT/JP2011/070465 filed on Sep. 8, 2011, claiming the benefit of priority from Japanese Patent Application No. 2010-210291 filed on Sep. 20, 2010. The entire contents of the applications are incorporated herein by reference.

TECHNICAL FIELD

The present invention relates to an aluminum structure which can be suitably used as a metal porous body for various filters, electrodes for batteries, and the like, and to a production method thereof.

BACKGROUND ART

Metal porous bodies having a three-dimensional network structure are widely used in various filters, catalyst supports, electrodes for batteries, and the like. For example, Celmet (registered trademark, manufactured by Sumitomo Electric Industries, Ltd.) composed of nickel is used as an electrode material for batteries, such as nickel metal hydride batteries and nickel cadmium batteries. Celmet is a metal porous body having open pores and is characterized by having a high porosity (90% or more) compared with other porous bodies, such as metal nonwoven fabrics. Celmet is obtained by forming a nickel layer on the surface of the skeleton of a porous resin having open pores, such as polyurethane foam, performing heat treatment to decompose the foamed resin molded body, and further subjecting the nickel to reduction treatment. The nickel layer is formed by applying carbon powder or the like to the surface of the skeleton of the foamed resin molded body to impart electrical conductivity, and then depositing nickel by electroplating.

Aluminum has excellent characteristics in terms of electrical conductivity, corrosion resistance, and lightweightness. Regarding use in batteries, for example, an aluminum foil having a surface coated with an active material, such as lithium cobalt oxide, has been used as a positive electrode of lithium ion batteries. In order to improve the capacity of the positive electrode, it is conceivable to form an aluminum porous body to increase the surface area so that the inside of the aluminum porous body can be filled with the active material. In that case, even if the thickness of the electrode is increased, the active material can be utilized, and the active material utilization ratio per unit area is improved.

Examples of porous aluminum include aluminum nonwoven fabrics in which aluminum fibers are entangled with each other and aluminum foams produced by foaming aluminum. Patent Document 1 discloses a method of producing a foamed metal having many closed cells, the method including adding a foaming agent and a thickening agent to a metal in a molten state, followed by stirring. Patent Document 2 describes a method of producing a metal porous body, in which the production method of Celmet is applied to aluminum, the method including forming a coating film of a metal (copper or the like) capable of forming a eutectic alloy at a temperature not higher than the melting point of aluminum on a skeleton of a foamed resin molded body having a three-dimensional network structure, applying an aluminum paste thereto, and performing heat treatment in a non-oxidizing atmosphere at a temperature of 550° C. to 750° C. to remove the organic component (foamed resin) and to sinter aluminum powder. Furthermore, Patent Document 3 describes a method of producing an aluminum porous body, the method including vapor-depositing aluminum, using an arc ion plating process, on a three-dimensional network-like plastic substrate having an inner communicating space to form a metallic aluminum layer with a thickness of 2 to 20 µm.

CITATION LIST

Patent Literature

Patent Document 1: Japanese Patent No. 4176975
Patent Document 2: Japanese Unexamined Patent Application Publication No. 8-170126
Patent Document 3: Japanese Patent No. 3413662

SUMMARY OF INVENTION

Technical Problem

In the case of aluminum nonwoven fabrics or aluminum foams, since aluminum is heated to a temperature equal to or higher than the melting point of aluminum in the production process, oxidation tends to proceed until cooling is performed, and an oxide film tends to be formed on the surface of aluminum. Aluminum is easily oxidized, and once oxidized, reduction is difficult at a temperature equal to or lower than the melting point. Therefore, it is not possible to obtain aluminum nonwoven fabrics or aluminum foams having a low oxygen content. Furthermore, in aluminum foams having closed cells (non-interconnecting cells), even if the surface area is increased by foaming, not all of the surfaces can be effectively used. Consequently, when aluminum foams are used as electrode materials (current collectors) of batteries, it is difficult to increase the utilization efficiency of the active material.

In the method of Patent Document 2, a layer which forms an eutectic alloy with aluminum is produced, and thus it is not possible to form a high-purity aluminum layer. Furthermore, although in a non-oxidizing atmosphere, it is necessary to perform heat treatment at a temperature close to the melting point of aluminum in order to sinter aluminum, and there is a possibility that an oxide film may be formed on the surface of aluminum.

In the method of Patent Document 3, it is possible to obtain an aluminum porous body with a thickness of 2 to 20 µm. However, since the vapor-phase method is used, large-area production is difficult, and depending on the thickness or porosity of the substrate, it is difficult to form a layer which is uniform even in the interior portion. Furthermore, regarding the removal of the three-dimensional network-like plastic substrate, it is described that "the method can be selected appropriately depending on the types of plastics, and for example, a method of removing the plastic substrate by melting or thermal decomposition, a method in which the plastic is dissolved in an appropriate organic solvent, or the like may be employed". However, specific removal methods are not described. No such methods are known, in particular, for removing urethane (polyurethane), which is suitably used as a resin porous body having a three-dimensional network structure, without oxidizing aluminum.

Accordingly, it is an object of the present invention to provide a method of producing an aluminum structure using a resin molded body composed of urethane, in particular, a porous resin molded body having a three-dimensional network structure, with which it is possible to form an aluminum structure having a low oxide content in the surface of aluminum (i.e., having an oxide film with a small thickness), and it is possible to obtain an aluminum porous body that has a large area and, in particular, that is suitable for use in batteries.

Solution to Problem

According to an embodiment of the present invention, there is provided a method of producing an aluminum structure including a step of preparing an aluminum-coated resin molded body in which an aluminum layer is formed, directly or with another layer therebetween, on a surface of a resin molded body composed of urethane, and a step of decomposing the resin molded body by bringing the aluminum-coated resin molded body into contact with concentrated nitric acid with a concentration of 62% or more (first invention).

The inventors of the present application have found that although urethane (polyurethane) is hard to dissolve in an organic solvent, it is dissolved in concentrated nitric acid and can be removed. Aluminum has a property of being dissolved in acid and alkali. However, in oxidizing concentrated nitric acid, a very thin oxide film (passivation film) is formed on the surface of aluminum, and aluminum does not dissolve any more. The present invention is characterized in that an optimum concentration of nitric acid has been found in order to achieve both removal of urethane by decomposition and insolubilization of aluminum.

According to the present invention, it is possible to obtain an aluminum structure having a low oxide content in the surface of aluminum, i.e., having an oxide film with a small thickness (eighth invention). In particular, when an aluminum-coated resin molded body in which an aluminum layer is formed on the surface of a complex skeleton structure, such as a resin porous body having a three-dimensional network structure, is used, it is possible to obtain an aluminum structure having a high porosity, which can be suitably used for batteries and the like (second invention).

When an aluminum-coated resin molded body is brought into contact with concentrated nitric acid with a concentration of 62% or more, urethane is decomposed to lower molecular weight urethane and dissolved out into concentrated nitric acid. After that, by performing cleaning, urethane is removed. When heat treatment is further performed in an inert atmosphere at a temperature of lower than 660° C. after urethane has been decomposed by contact with concentrated nitric acid, the removal ratio of urethane is increased, thus making it possible to obtain an aluminum structure having less impurities. The heat treatment is preferably performed in the temperature range of 200° C. to 400° C. in order to more stably suppress oxidation of aluminum (third invention). Furthermore, by bringing the aluminum structure into contact with an organic solvent to remove the decomposition product of the resin molded body after urethane has been decomposed by contact with concentrated nitric acid, the removal ratio of urethane can be increased (fourth invention).

The aluminum-coated resin molded body can be obtained by forming an aluminum layer on the surface of the resin molded body composed of urethane by any method, for example, a vapor-phase method, such as vapor deposition, sputtering, or plasma CVD, application of aluminum paste, plating or the like. Regarding aluminum plating, since aluminum has a high affinity for oxygen and a lower potential than hydrogen, it is difficult to perform electroplating in an aqueous solution-based plating bath. Consequently, it is preferable to perform molten salt electrolytic plating in which aluminum plating is performed in a molten salt. According to a preferred embodiment, the step of preparing an aluminum-coated resin molded body includes a conductivity-imparting step in which electrical conductivity is imparted to the surface of the resin molded body and a step of forming an aluminum layer by performing aluminum plating in a molten salt (fifth invention). The impartment of electrical conductivity to the surface of the resin molded body makes it possible to perform aluminum plating in a molten salt.

The conductivity-imparting step is preferably a step of attaching aluminum by a vapor-phase method (sixth invention). By attaching aluminum to impart conductivity to the surface of the resin molded body, it is possible to obtain an aluminum structure which does not substantially include a metal other than aluminum.

The conductivity-imparting step may be a step of attaching one or more metals selected from the group consisting of nickel, copper, cobalt, and iron by electroless plating to the surface of the resin molded body (seventh invention). By using electroless plating, it is possible to form a uniform conductive layer even on a resin molded body, for example, having a complex structure including a fine three-dimensional network structure, and thus, the subsequent aluminum plating can be easily formed uniformly. Furthermore, since nickel, copper, cobalt, and iron dissolve in concentrated nitric acid, the conductive layer composed of these metals are removed in the step of decomposing the resin molded body, and it is possible to obtain an aluminum structure having a high aluminum purity.

Advantageous Effects of Invention

According to the present invention, it is possible to provide a method of producing an aluminum structure using a resin molded body composed of urethane, in particular, a porous resin molded body having a three-dimensional network structure, with which it is possible to form an aluminum structure having a low oxide content in the surface of aluminum (i.e., having an oxide film with a small thickness), and to provide an aluminum structure.

BRIEF DESCRIPTION OF THE DRAWINGS

[FIG. 1]

[FIG. 2A]

[FIG. 3]

[FIG. 4]

[FIG. 5]

[FIG. 6]

[FIG. 7]

DESCRIPTION OF EMBODIMENTS

The embodiments of the present invention will be described below. In the drawings to which reference is made, the same reference numerals denote the same or corresponding portions. It is intended that the scope of the present invention is determined not by the embodiments but by appended claims, and includes all variations of the equivalent meanings and ranges to the claims.

(Production process of aluminum structure)

Figure 1:
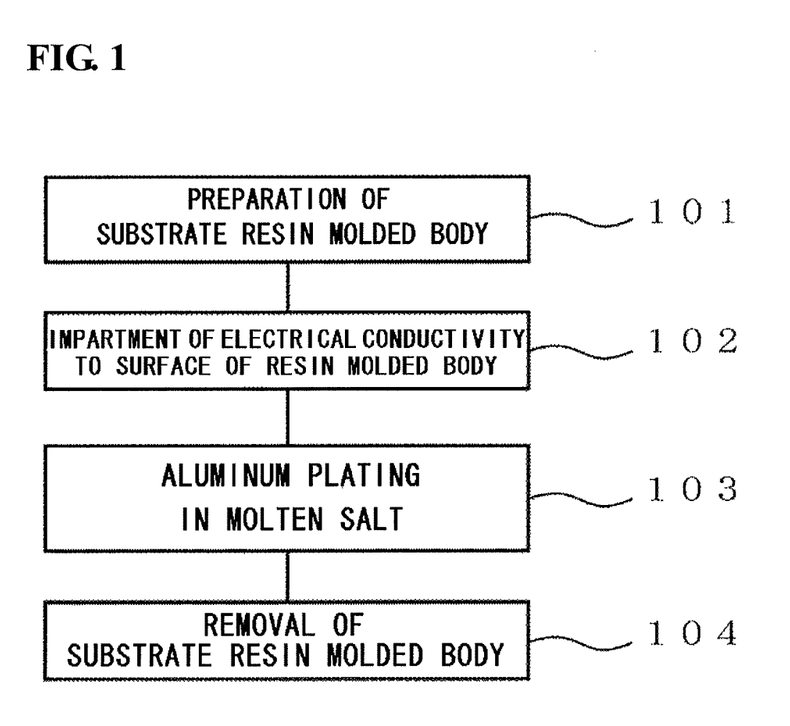
FIG. 1 is a flow diagram showing a production process of an aluminum structure according to the present invention.
Figure 2A:
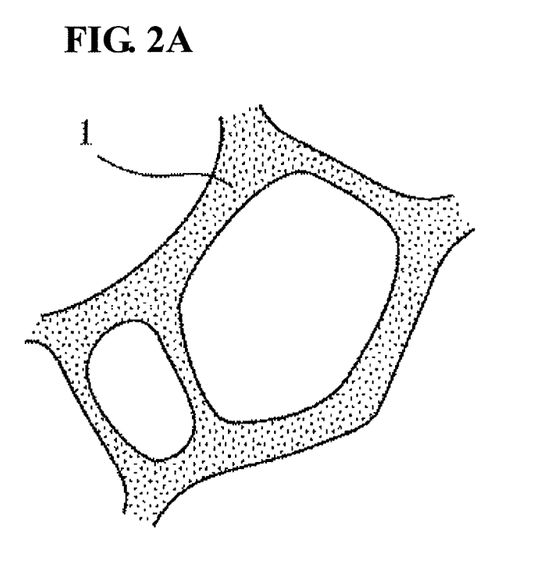
FIGS. 2A to 2D are cross-sectional schematic views illustrating the production process of an aluminum structure according to the present invention.
Figure 2B:
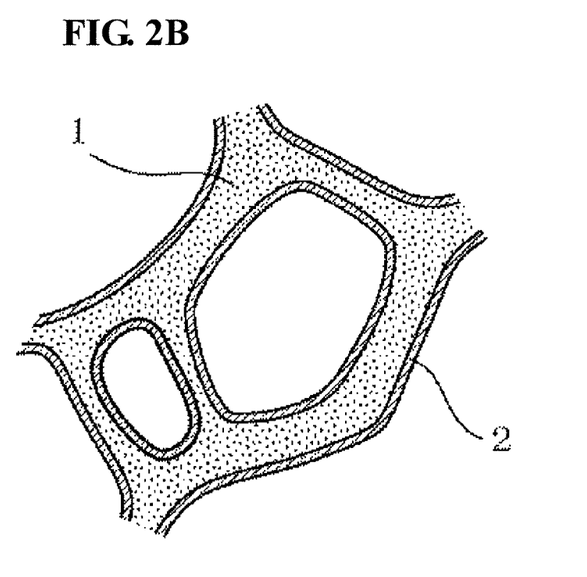
Figure 2C:
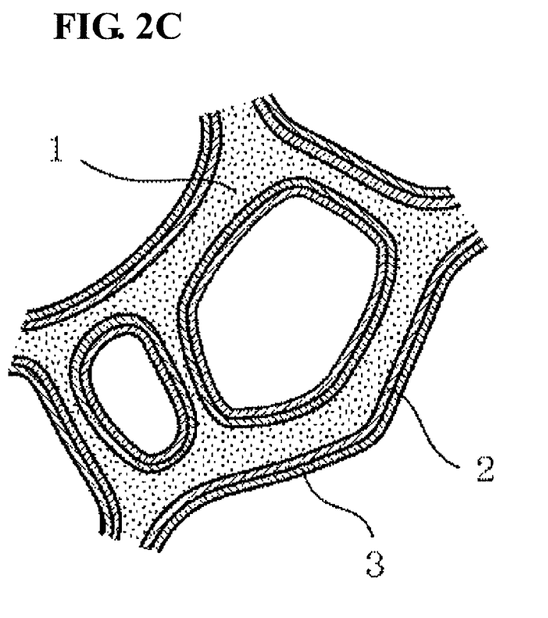
Figure 2D:
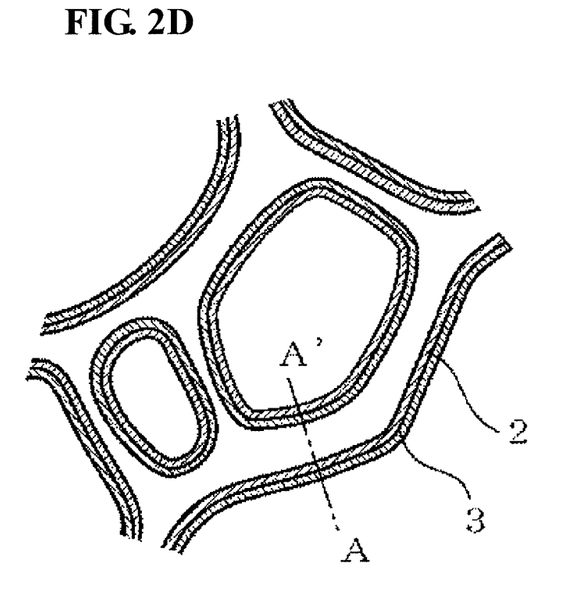

FIG. 1 is a flow diagram showing a production process of an aluminum structure according to the present invention. FIGS. 2A to 2D correspond to the flow diagram and schematically show how an aluminum structure is produced using a resin molded body as a core. The entire flow of the production process will be described with reference to FIG. 1 and FIGS. 2A to 2D. First, preparation of a substrate resin molded body (101) is performed. FIG. 2A is an enlarged schematic view showing a portion of a cross section of a resin molded body, which is a foamed resin molded body having open pores, as an example of a substrate resin molded body. A foamed resin molded body 1 serves as a skeleton and has pores therein. Next, impartment of electrical conductivity to the surface of the resin molded body (102) is performed. Thereby, as shown in FIG. 2B, a conductive layer 2 is thinly formed on the surface of the resin molded body 1. Subsequently, aluminum plating in a molten salt (103) is performed to form an aluminum plating layer 3 on the surface of the resin molded body provided with the conductive layer (refer to FIG. 2C). Thus, an aluminum-coated resin molded body, which includes the resin molded body serving as a substrate and the aluminum plating layer 3 formed on the surface thereof, is obtained. Then, removal of the substrate resin molded body (104) is performed. By bringing the aluminum-coated resin molded body into contact with concentrated nitric acid with a concentration of 62% or more to decompose and remove the foamed resin molded body 1, an aluminum structure (porous body) including the metal layer only can be obtained (FIG. 2D). The individual steps will be described in order below.

(Preparation of Porous Resin Molded Body)

A foamed resin molded body composed of urethane having a three-dimensional network structure and open pores is prepared. A resin molded body having any shape can be selected as long as it has interconnecting pores (open pores). For example, a body having a nonwoven fabric-like shape in which resin fibers are entangled with each other can be used instead of the foamed resin molded body. Preferably, the foamed resin molded body has a porosity of 80% to 98% and a pore size of 50 to 500 µm. Polyurethane foam has a high porosity, an interconnecting property of pores, and excellent uniformity of pores, and thus polyurethane foam can be suitably used as a foamed resin molded body.

Figure 3:
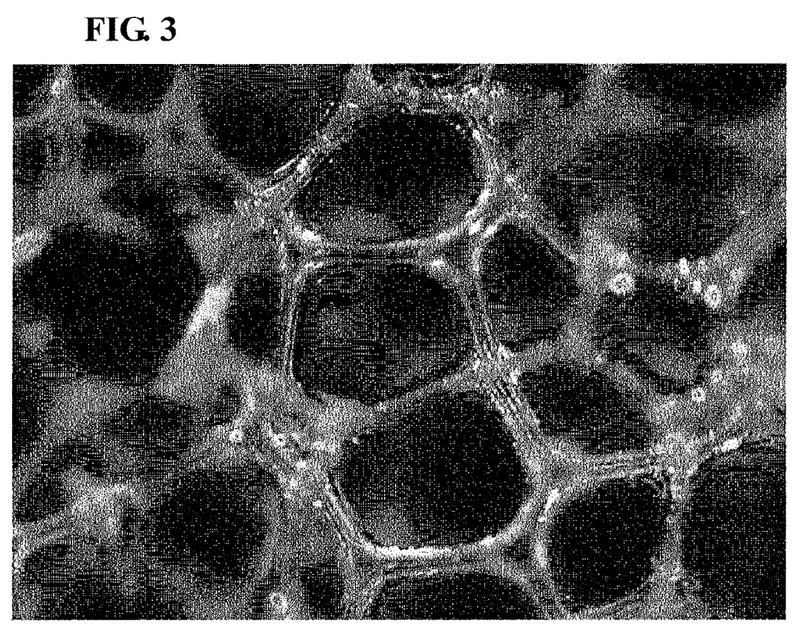
FIG. 3 is a magnified surface photograph showing a structure of a polyurethane foam resin as an example of a porous resin molded body.

In many cases, the foamed resin molded body has residues, such as a foaming agent and unreacted monomers, in the foam production process, and it is preferable to carry out cleaning treatment for the subsequent steps. FIG. 3 shows polyurethane foam which has been subjected to cleaning treatment as an example of a foamed resin molded body. The resin molded body, as a skeleton, constitutes a three-dimensional network, and thus, as a whole, interconnecting pores are formed. In the skeleton of the polyurethane foam, a cross section perpendicular to the direction in which the skeleton extends has a substantially triangular shape. The porosity is defined by the following formula:

Porosity=(1−(weight of porous material [g]/(volume of porous material [cm$^3$]×material density)))× 100[%]

Furthermore, the pore size is determined by a method in which a magnified surface of a resin molded body is obtained by a photomicroscope or the like, the number of cells per inch (25.4 mm) is calculated, and an average value is obtained by the formula: average pore size=25.4 mm/number of cells.

(Impartment of Electrical Conductivity to Surface of Resin Molded Body: Vapor-Phase Method)

First, a conductive layer is formed on the surface of the foamed resin molded body. When the conductive layer is formed using aluminum, a high-purity aluminum structure can be obtained, which is preferable. The conductive layer can be formed by any method, for example, a vapor-phase method, such as vapor deposition, sputtering, or plasma CVD, application of aluminum paint, or the like. Vapor deposition is preferable because a thin film can be uniformly formed. The thickness of the conductive layer is 0.01 to 1 µm, and preferably 0.1 to 0.5 µm. When the thickness of the conductive layer is less than 0.01 µm, impartment of electrical conductivity is insufficient, and electrolytic plating cannot be performed satisfactorily in the subsequent step. When the thickness exceeds 1 µm, the cost for carrying out the conductivity-imparting step increases.

(Impartment of Electrical Conductivity to Surface of Resin Molded Body: Paint)

The conductivity-imparting treatment may be carried out by immersing the foamed resin molded body in paint containing aluminum. The aluminum component contained in the paint attaches to the surface of the foamed resin molded body to form a conductive layer composed of aluminum, thereby producing a conductive state that can be plated in a molten salt. As the paint containing aluminum, for example, a solution obtained by dispersing aluminum fine particles with a particle size of 10 nm to 1 µm in water or an organic solvent can be used. After immersing the foamed resin molded body in paint, the solvent is evaporated by heating, and thus a conductive layer is formed.

(Plating Pretreatment: Anode Electrolysis)

An aluminum plating layer is formed on the conductive layer formed in the step described above by aluminum plating using molten salt plating. In this case, if an oxide film is present on the surface of the conductive layer, adhesion of aluminum is degraded in the subsequent plating step, which may result in island-like adhesion of aluminum, or a variation in the thickness of the aluminum plating layer. Therefore, preferably, anode electrolysis treatment is performed before the plating step so that the oxide film (aluminum oxide layer) generated on the surface of the conductive layer (aluminum layer) is dissolved and removed. Specifically, the resin molded body imparted with electrical conductivity and a counter electrode, such as an aluminum sheet, are immersed in a molten salt, and with the resin molded body imparted with electrical conductivity (conductive layer) serving as an anode and the counter electrode serving as a cathode, a DC current is applied. The molten salt to be used may be the same as or different from that used in the subsequent molten salt plating step.

(Plating Pretreatment: Non-Oxidizing Atmosphere)

As another technique for preventing oxidation of the conductive layer (aluminum layer), it is conceivable that, after the conductive layer is formed, the resin molded body provided with the conductive layer (resin molded body imparted with electrical conductivity) is transferred to the subsequent plating step without being exposed to an oxidizing atmosphere. For example, a vapor deposition system and a molten salt plating apparatus are placed in an argon atmosphere, and after the conductivity-imparting step is carried out by vapor deposition in the argon atmosphere, the sample is transferred to the next step in the argon atmosphere to carry out the molten salt plating. By such a technique, plating can be performed without oxidizing the surface of the conductive layer formed in the conductivity-imparting step.

(Impartment of Electrical Conductivity to Surface of Resin Molded Body: Electroless Plating)

Formation of a conductive layer may be performed by attaching one or more metals selected from the group consisting of nickel, copper, cobalt, and iron to the surface of the foamed resin molded body. The conductive layer can be formed, in addition to by electroless plating, by any method, for example, a vapor-phase method, such as vapor deposition, sputtering, or plasma CVD, application of paint, or the like. In order to form a thin film, a vapor-phase method, such as vapor deposition, can be suitably used. However, in a foamed resin molded body, when the thickness is large, it is difficult to form a layer which is uniform overall even in the deep portion. Therefore, the conductive layer is preferably formed by electroless plating. The thickness of the conductive layer is 0.01 to 1 μm, and preferably 0.1 to 0.5 μm When the thickness of the conductive layer is less than 0.01 μm, impartment of electrical conductivity is insufficient, and electrolytic plating cannot be performed satisfactorily in the subsequent step. When the thickness exceeds 1 μm, the cost for carrying out the conductivity-imparting step increases.

The method of electroless plating is not limited. For example, a case where nickel is plated onto a urethane foam will be described. First, a colloid catalyst including palladium chloride and tin chloride is made to adsorb on the surface of urethane. Next, tin (Sn) is removed by sulfuric acid to activate the catalyst. Then, by immersing the urethane foam in a nickel plating solution in which hypophosphorous acid is used as a reducing agent, nickel electroless plating can be performed. In this case, by using hypophosphorous acid as a reducing agent, phosphorous is unavoidably codeposited to form a phosphorous alloy.

(Formation of Aluminum Layer: Molten Salt Plating)

Next, electrolytic plating is performed in a molten salt to form an aluminum plating layer 3 on the surface of the resin molded body. Using the resin molded body, the surface of which has been imparted with electrical conductivity, as a cathode and an aluminum sheet having a purity of 99.99% as an anode, a DC current is applied in the molten salt. The thickness of the aluminum plating layer is 1 to 100 μm, and preferably 5 to 20 μm. As the molten salt, an organic molten salt which is a eutectic salt of an organic halide and an aluminum halide or an inorganic molten salt which is a eutectic salt of an alkali metal halide and an aluminum halide can be used. When a bath of an organic molten salt which melts at a relatively low temperature is used, the resin molded body serving as a substrate can be plated without being decomposed, thus being preferable. As the organic halide, an imidazolium salt, pyridinium salt, or the like can be used. Above all, 1-ethyl-3-methylimidazolium chloride (EMIC) and butylpyridinium chloride (BPC) are preferable. As the imidazolium salt, a salt containing an imidazolium cation having alkyl groups at the 1- and 3-positions is preferably used. In particular, an aluminum chloride-1-ethyl-3-methylimidazolium chloride ($AlCl_3$-EMIC) molten salt is most preferably used because it has high stability and is hard to decompose.

When moisture or oxygen is mixed into a molten salt, the molten salt is degraded. Therefore, preferably, plating is performed in an inert gas atmosphere, such as nitrogen or argon, and under a sealed environment. In the case where an EMIC bath is used as the organic molten salt bath, the temperature of the plating bath is 10° C. to 60° C., and preferably 25° C. to 45° C.

In the case where an imidazolium salt bath is used as the molten salt bath, preferably, an organic solvent is added to the molten salt bath. As the organic solvent, xylene is particularly preferably used. Addition of an organic solvent, in particular, xylene, exhibits particular effects in forming an aluminum porous body. That is, a first feature is that the aluminum skeleton constituting the porous body is hard to break, and a second feature is that it is possible to perform uniform plating in which the difference in plating thickness between the surface portion and the interior portion of the porous body is small. The first feature results from the fact that, by addition of the organic solvent, the plating in the surface of the skeleton is improved, from the granular shape (because of large irregularities, the surface appears to be granular when observed) to the planar shape, and thereby the thin, fine skeleton is solidified. The second feature results from the fact that, by adding the organic solvent to the molten salt bath, the viscosity of the molten salt bath is decreased, and the plating bath easily circulates to the interior of the fine network structure. That is, when the viscosity is high, a new plating bath is easily supplied to the surface of the porous body, but is not easily supplied to the interior portion. By decreasing the viscosity, the plating bath is easily supplied to the interior portion, and therefore, it becomes possible to perform plating at a uniform thickness. The amount of the organic solvent to be added to the plating bath is preferably 25 to 57 mole percent. At 25 mole percent or less, the effect of decreasing the difference in thickness between the surface layer and the interior portion is hard to obtain. At 57 mole percent or more, the plating bath becomes unstable, and the plating solution and xylene are partially separated from each other.

Subsequent to the step of plating using the molten salt bath to which the organic solvent has been added, preferably, a cleaning step in which the organic solvent is used as a cleaning liquid is further performed. The surface of plated resin requires cleaning in order to wash off the plating bath. Such cleaning after plating is usually performed using water. However, it is necessary that the imidazolium salt bath should avoid moisture. If cleaning is performed using water, water in the form of vapor or the like is brought into the plating solution. Consequently, in order to avoid adverse effects on plating, cleaning with water should be avoided. Accordingly, cleaning with an organic solvent is effective. Furthermore, as described above, in the case where an organic solvent is added to the plating bath, by performing cleaning using the organic solvent added to the plating bath, a further advantageous effect can be obtained. That is, recovery and reuse of the plating solution cleaned can be relatively easily performed, resulting in cost reduction. Take, for example, a case where a plated resin to which a bath, including molten salt $AlCl_3$-EMIC and xylene added thereto, adheres is cleaned using xylene. The liquid cleaned contains a larger amount of xylene compared with the plating bath used. A certain amount or more of the molten salt $AlCl_3$-EMIC is not mixed into xylene, and a separation occurs in which xylene is present on the upper side and the molten salt $AlCl_3$-EMIC containing about 57 mole percent xylene is present on the lower side. By drawing liquid in the lower side, the molten solution can be collected. Furthermore, since the boiling point of xylene is low at 144° C., by applying heat, it is possible to adjust the xylene concentration in the collected molten salt to the concentration in the plating solution so that the collected molten salt can be reused. In addition, after cleaning with the organic solvent is performed, further cleaning using water in another place apart from the plating bath may be preferably performed.

Figure 5:
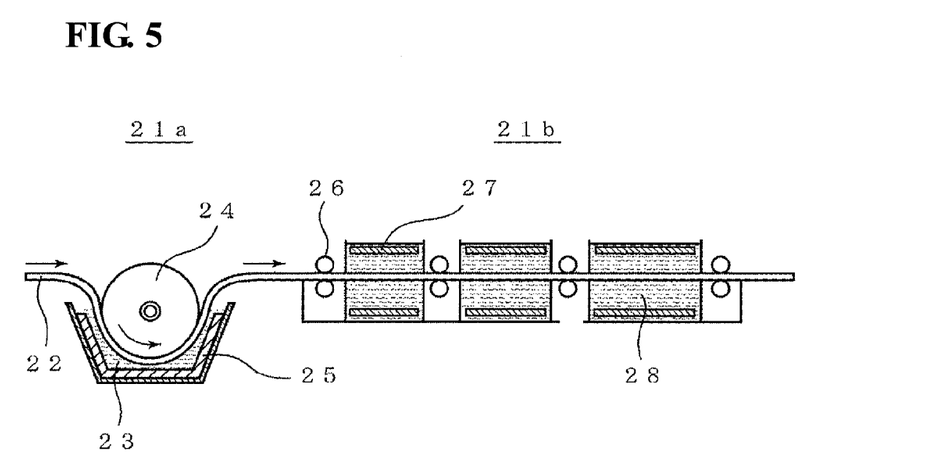
FIG. 5 is a diagram illustrating an example of a continuous aluminum plating process using molten salt plating.

FIG. 5 is a schematic diagram showing a structure of an apparatus for performing metal plating treatment continuously on a strip-shaped resin. In the structure, a strip-shaped resin 22, the surface of which has been imparted with electrical conductivity, is transferred from left to right in the drawing. A first plating tank 21a includes a cylindrical electrode 24, a positive electrode 25 provided on the inner wall of a container, and a plating bath 23. Since the strip-shaped resin 22 passes through the plating bath 23 along the cylindrical electrode 24, a current easily flows in the entire resin uniformly, and thus, uniform plating can be obtained. A plating tank 21b is used for plating more thickly and uniformly and is configured so that plating is performed repeatedly using a plurality of tanks. While being sequentially transferred by feed rollers and electrode rollers 26 which also serve as feeding negative electrodes disposed outside the tank, the strip-shaped resin 22 having a thin metal layer on the surface thereof is passed through a plating bath 28, and thus plating is performed. In each of a plurality of tanks, positive electrodes 27 are provided on both surfaces of the resin with the plating bath 28 therebetween, and it is possible to perform plating more uniformly on both surfaces of the resin.

(Decomposition of resin: concentrated nitric acid treatment)

Through the steps described above, it is possible to obtain an aluminum-coated resin molded body including a resin molded body as a core of the skeleton. Next, the substrate resin molded body is removed. The aluminum-coated resin molded body having an aluminum plating layer on the surface thereof is brought into contact with concentrated nitric acid which is an oxidizing acid. The aluminum-coated resin molded body may be immersed in a concentrated nitric acid solution or a concentrated nitric acid solution may be sprayed onto the aluminum-coated resin molded body. The concentration of the concentrated nitric acid is set at 62% or more. In this step, urethane is decomposed, and urethane, the molecular weight of which has been decreased, is dissolved in nitric acid and can be removed. Aluminum is not substantially dissolved, and the porous structure originating from the foamed resin molded body is maintained. When the concentration of nitric acid is less than 62%, although the molecular weight of urethane is decreased to a certain extent, the solid content remains. Thus, it is not possible to completely remove urethane. Furthermore, when the concentration is less than 62%, the amount of dissolution of aluminum increases, and it is not possible to obtain a satisfactory aluminum structure. Although not particularly limited, the upper limit of the concentration of concentrated nitric acid is practically about 70%. Since concentric nitric acid is a liquid with a low viscosity, the liquid easily penetrates into minute parts of the porous aluminum-coated resin molded body, and it is possible to decomposed urethane uniformly without irregularities.

In the case where a metal other than aluminum, such as nickel or copper, is used as the conductive layer, the metal used as the conductive layer is dissolved in this step. For example, when nickel is used as the conductive layer, by immersing the aluminum-coated resin molded body in concentrated nitric acid (concentration 67.5%) at 15° C. to 35° C. for 1 to 30 minutes, followed by washing with water and drying, removal of the conductive layer composed of nickel and decomposition of urethane can be simultaneously performed.

(Decomposition of Resin: Heat Treatment)

Through the step described above, urethane is removed and an aluminum structure is obtained. However, since there is a possibility that a small amount of the decomposition product of urethane, the molecular weight of which has been decreased, may remain, it is preferable to perform post-treatment. As the post-treatment method, heat treatment, contact with an organic solvent, or the like may be mentioned. In the case of heat treatment, preferably, heat treatment is performed at a temperature lower than 660° C. at which aluminum melts. Since the molecular weight of the urethane remaining on the aluminum structure has been decreased in the nitric acid treatment step, the urethane can be decomposed and removed at a temperature lower than 660° C. At this temperature, urethane can be removed without substantially oxidizing aluminum. However, in order to suppress oxidation of aluminum stably, the heat treatment is preferably performed at 200° C. to 400° C. Furthermore, in order to prevent oxidation of aluminum, the heat treatment is preferably performed in an inert gas atmosphere. By removing the resin by such a method, the thickness of the surface oxide layer can be decreased (the oxygen content can be decreased). In order to more efficiently remove the urethane residue, it is preferable to perform heat treatment while flowing a gas, such as nitrogen gas.

(Decomposition of Resin: Organic Solvent Treatment)

Post-treatment may be performed by bringing the aluminum structure into contact with an organic solvent. The aluminum structure subjected to the concentrated nitric acid treatment may be immersed in an organic solvent, or an organic solvent may be sprayed onto the aluminum structure subjected to the concentrated nitric acid treatment. These post-treatments may be performed alone or in combination. As the organic solvent, any organic solvent, such as acetone, ethanol, or toluene, can be used. A halogen-based organic solvent, such as a bromine-based solvent, chlorine-based solvent, or fluorine-based solvent, has excellent solubility and noncombustibility, and thus is preferable in terms of safety.

Figure 4:
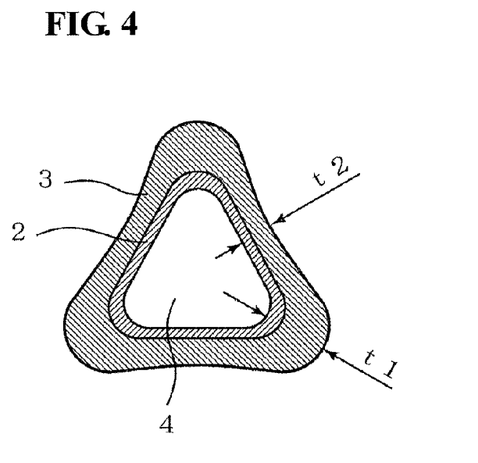
FIG. 4 is a schematic diagram illustrating a cross section of a skeleton of an aluminum porous body.

FIG. 4 is a schematic view showing a cross section taken along the line A-A' of FIG. 2D. The conductive layer 2 and the aluminum layer composed of the aluminum plating layer 3 have a tubular skeleton structure, and a cavity 4 located in the skeleton structure has a substantially triangular cross-sectional shape. The thickness (t1) of the aluminum layer including the conductive layer at the apex portion of the triangle is larger than the thickness (t2) at the center of the side of the triangle. The reason for formation of such a shape is assumed to be that an electric field is concentrated in the corner portion (apex portion of the triangle) when the aluminum layer is formed by plating. That is, by the production method of the present invention, it is possible to obtain an aluminum structure in which the skeleton structure has a substantially triangular cross section and the thickness of the aluminum layer at the apex portion of the triangle is larger than the thickness of the aluminum layer at the center of the side of the triangle.

(Lithium Ion Battery)

An electrode material for batteries including an aluminum structure, and a battery will be described below. For example, in the case where an aluminum structure is used as a positive electrode of a lithium ion battery, lithium cobalt oxide ($LiCoO_2$), lithium manganate ($LiMn_2O_4$), lithium nickel oxide ($LiNiO_2$), or the like is used as an active material. The active material is used in combination with a conductive additive and a binder. In a known positive electrode material for lithium ion batteries, an active material is applied by coating onto the surface of an aluminum foil. In order to improve the battery capacity per unit area, the coating thickness of the active material is increased. Furthermore, in order to effectively use the active material, it is necessary that the aluminum foil and the active material be electrically in contact with each other. Accordingly, the active material is mixed with the conductive additive for use. In contrast, the aluminum structure of the present invention has a high porosity and a large surface area per unit area. Therefore, even when a thin active material layer is carried on the surface of the aluminum structure, the active material can be effectively used, and the battery capacity can be improved. Furthermore, the amount of the conductive additive to be mixed can be decreased. In a lithium ion battery, the positive electrode material is used for a positive electrode, graphite is used for a negative electrode, and an organic electrolytic solution is used for an electrolyte. In such a lithium ion battery, the capacity can be improved even with a small electrode area, and thus it is possible to increase the energy density of the battery compared with the known lithium ion battery.

(Molten Salt Battery)

An aluminum structure can also be used as an electrode material for a molten salt battery. In the case where an aluminum porous body is used as a positive electrode material, a metal compound, such as sodium chromite ($NaCrO_2$) or titanium disulfide ($TiS_2$), into which cations of the molten salt serving as an electrolyte can be intercalated, is used as an active material. The active material is used in combination with a conductive additive and a binder. As the conductive additive, acetylene black or the like can be used. As the binder, polytetrafluoroethylene (PTFE) or the like can be used. In the case where sodium chromite is used as the active material and acetylene black is used as the conductive additive, PTFE can strongly bind both materials, which is preferable.

An aluminum structure can also be used as a negative electrode material for molten salt batteries. In the case where the aluminum porous body is used as a negative electrode material, elemental sodium, an alloy of sodium and another metal, carbon, or the like can be used as an active material. The melting point of sodium is about 98° C., and as the temperature increases, the metal becomes soft. Therefore, it is preferable to alloy sodium with another metal (Si, Sn, In, or the like). Among these, in particular, an alloy of sodium and Sn is easy to handle, thus being preferable. Sodium or a sodium alloy can be carried on the surface of the aluminum porous body by electrolytic plating, hot dip coating, or the like. Another method may be used in which, after a metal (Si or the like) to be alloyed with sodium is attached to the aluminum porous body by plating or the like, charging is performed in a molten salt battery to form a sodium alloy.

Figure 6:
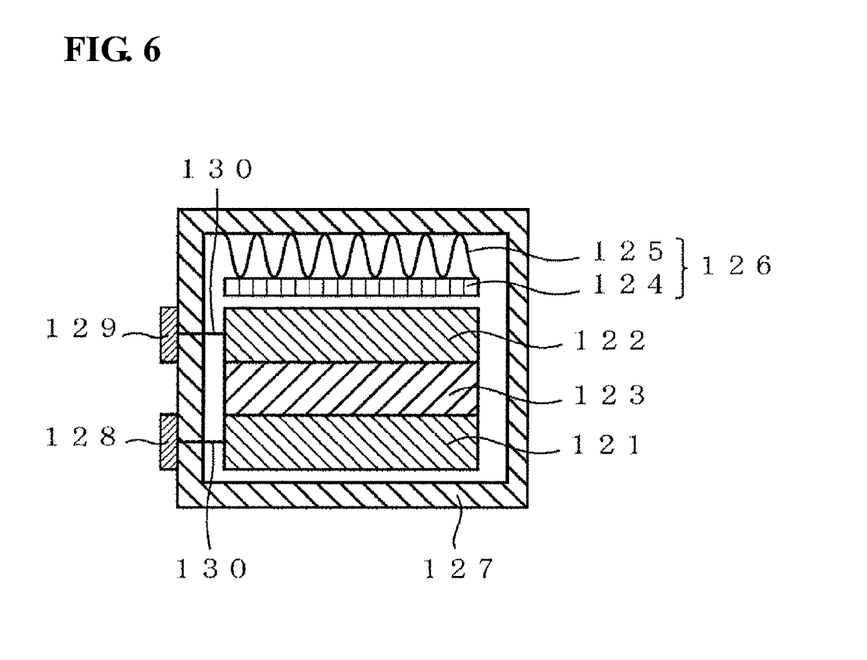
FIG. 6 is a cross-sectional schematic view showing a structural example in which aluminum porous bodies are used in a molten salt battery.

FIG. 6 is a cross-sectional schematic view showing an example of a molten salt battery in which the electrode materials for batteries are used. In the molten salt battery, a positive electrode 121 in which an active material for the positive electrode is carried on the surface of an aluminum skeleton of an aluminum structure, a negative electrode 122 in which an active material for the negative electrode is carried on the surface of an aluminum skeleton of an aluminum structure, and a separator 123 impregnated with a molten salt serving as an electrolyte are housed in a case 127. A pressing member 126 which includes a pressure plate 124 and a spring 125 that presses the pressure plate 124 is disposed between the upper surface of the case 127 and the negative electrode 122. By providing the pressing member 126, even when volume changes occur in the positive electrode 121, the negative electrode 122, and the separator 123, pressing is performed uniformly so that contact between the individual members can be achieved. The current collector (aluminum porous body) of the positive electrode 121 and the current collector (aluminum porous body) of the negative electrode 122 are respectively connected to a positive electrode terminal 128 and a negative electrode terminal 129 by leads 130.

As the molten salt serving as an electrolyte, any of various inorganic salts and organic salts that melt at the operating temperature can be used. As the cation of the molten salt, at least one selected from the group consisting of alkali metals, such as lithium (Li), sodium (Na), potassium (K), rubidium (Rb), and cesium (Cs), and alkaline-earth metals, such as beryllium (Be), magnesium (Mg), calcium (Ca), strontium (Sr), and barium (Ba), can be used.

In order to decrease the melting point of the molten salt, preferably, two or more salts are mixed for use. For example, when potassium bis(fluorosulfonyl)amide (KFSA) and sodium bis(fluorosulfonyl)amide (NaFSA) are combined for use, the operating temperature of the battery can be set at 90° C. or lower.

The molten salt is used by being impregnated into the separator. The separator prevents the positive electrode and the negative electrode from being brought into contact with each other, and a glass nonwoven fabric, a porous resin, or the like can be used as the separator. The positive electrode, the separator impregnated with the molten salt, and the negative electrode are stacked and housed in the case, and then used as a battery.

(Electric Double-Layer Capacitor)

Aluminum structures can also be used as electrode materials for electric double-layer capacitors. When an aluminum structure is used as an electrode material for an electric double-layer capacitor, activated carbon or the like is used as an electrode active material. Activated carbon is used in combination with a conductive additive and a binder. As the conductive additive, graphite, carbon nanotubes, or the like can be used. As the binder, polytetrafluoroethylene (PTFE), styrene-butadiene rubber, or the like can be used.

Figure 7:
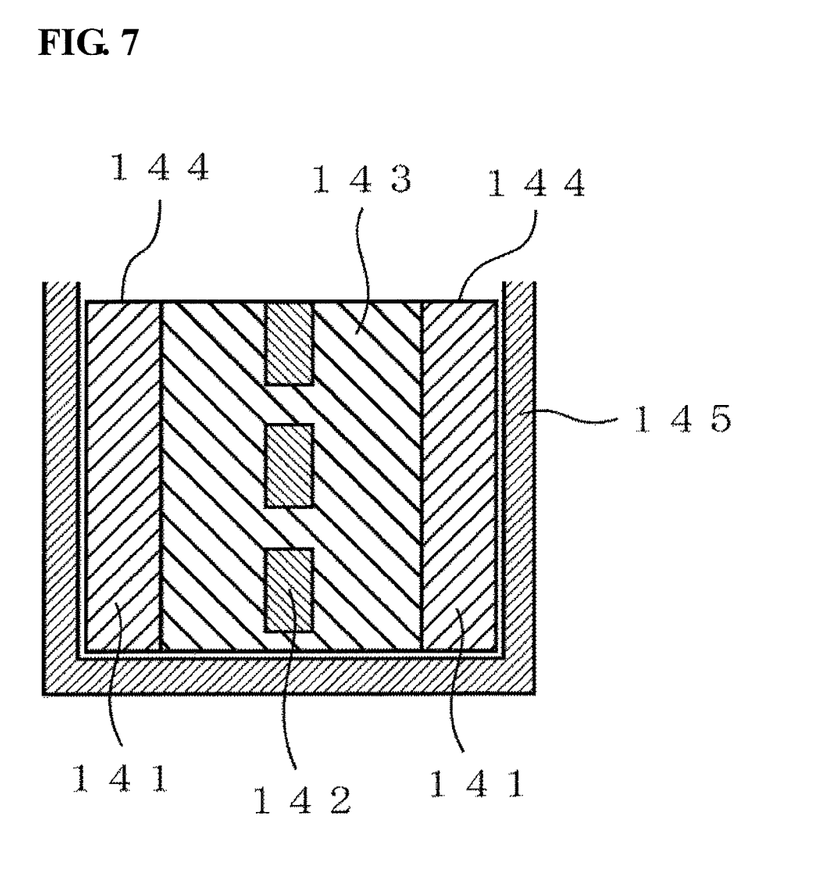
FIG. 7 is a cross-sectional schematic view showing a structural example in which aluminum porous bodies are used in an electric double-layer capacitor.

FIG. 7 is a cross-sectional schematic view showing an example of an electric double-layer capacitor in which the electrode materials for electric double-layer capacitors are used. Electrode materials as polarizable electrodes 141, in each of which an electrode active material is carried on an aluminum structure, are placed in an organic electrolytic solution 143 separated by a separator 142. The electrode materials 141 are connected to leads 144, and all of these components are housed in a case 145. By using aluminum porous bodies as current collectors, the surface areas of the current collectors increase, and even when activated carbon as the active material is thinly applied, it is possible to obtain an electric double-layer capacitor capable of increasing output and capacity.

The examples in which foamed resin molded bodies are used as resin molded bodies have been described above. However, the present invention is not limited to foamed resin molded bodies, and by using a resin molded body having any shape, it is possible to obtain an aluminum structure having any desired shape.

EXPERIMENTAL EXAMPLE

Study on Decomposition Conditions for Urethane

A urethane foam having a thickness of 1 mm, a porosity of 95%, and a number of pores per cm of about 20 was prepared, and three samples were formed, each by cutting the urethane foam into a square of 15 mm×15 mm. The urethane foam samples were immersed in concentrated nitric acid (100 ml) with a concentration of 55%, 62%, or 66%, and 15 minutes later, the appearance was observed. The samples immersed in concentrated nitric acid with a concentration of 62% or 69% were completely dissolved, and no solids remained. In contrast, although the sample immersed in concentrated nitric acid with a concentration of 55% dissolved, a small amount of solids remained.

EXPERIMENTAL EXAMPLE

Study on Dissolution Conditions for Aluminum

By cutting an aluminum sheet with a thickness of 1 mm, 0.6975 g (mass) of an aluminum sheet sample was formed. The sample was immersed in 100 ml of concentrated nitric acid with a concentration of 62% for 15 minutes, and then washing with water and drying were performed. The mass of the sample was measured. The mass after drying was 0.6973 g, and there was substantially no change in mass. The result confirms that aluminum is not dissolved in concentrated nitric acid with a concentration of 62%.

EXAMPLE

Production of Aluminum Porous Body: Formation of Aluminum Layer by Vapor Deposition A production example of an aluminum porous body will be specifically described below. A urethane foam with a thickness of 1 mm, a porosity of 95%, and a number of pores per cm of about 20 was prepared as a foamed resin molded body, and cut into a square of 15 mm×15 mm. Aluminum was vapor-deposited on the surface of the urethane foam to form a conductive layer with a thickness of about 0.3 µm.
(Anode Electrolysis)

The urethane foam having the conductive layer on the surface thereof was set on a jig having a feeding function, and then immersed in a molten salt aluminum plating bath (67 mol % $AlCl_3$-33 mol % EMIC) at a temperature of 40° C. The jig on which the urethane foam was set was connected to the anode side of a rectifier, and an aluminum sheet (purity 99.99%) as a counter electrode was connected to the cathode side. A DC current with a current density of 1 $A/dm^2$ was applied for one minute to perform anode electrolysis. Note that, in the calculation of the current density, the apparent area of the aluminum porous body was used.
(Molten Salt Plating)

With the urethane foam having the conductive layer on the surface thereof being immersed in the molten salt aluminum plating bath, the anode and the cathode of the rectifier were reversed. Then, the temperature was set at 40° C., and a DC current with a current density of 3.6 $A/dm^2$ was applied for 90 minutes to perform aluminum plating.
(Production of Aluminum Porous Body: Decomposition of Foamed Resin Molded Body)

Samples were produced each by cutting a foamed resin molded body provided with an aluminum plating layer into a square of 15 mm×15 mm, and immersed in concentrated nitric acid with a concentration of 62%, 55%, or 48% for 15 minutes. Then, washing with water and drying were performed and the appearance was observed. In the sample immersed in concentrated nitric acid with a concentration of 62%, the aluminum portion was not dissolved. However, in the samples immersed in concentric nitric acid with a concentration of 55% or 48%, aluminum was dissolved and the shape was changed. In the sample immersed in concentrated nitric acid with a concentration of 62%, the mass before immersion was 141 $g/m^2$, and the mass after immersion was 107 $g/m^2$. Thus, the decrease in mass was 34 $g/m^2$. Since the mass of the urethane foam used was about 30 $g/m^2$, it was assumed that nearly all of the urethane was removed.

(Production of Aluminum Porous Body: Decomposition of Foamed Resin Molded Body)

The sample immersed in concentrated nitric acid with a concentration of 62% was subjected to heat treatment in nitrogen gas at 300° C. for 10 minutes. Then, the sample was analyzed by gas chromatography in helium gas at 300° C. for 10 minutes, and the amount of residual urethane was measured. No peaks were observed and it was confirmed that substantially no urethane remained. Furthermore, the surface of aluminum was subjected to quantitative analysis by SEM-EDX, and it was confirmed that the oxygen content in the surface was 5% by weight or less.

The description made above includes the following features.
(Additional Statement 1)

An electrode material in which an active material is carried on the surface of aluminum of an aluminum structure obtained by the present invention.
(Additional Statement 2)

A battery which uses the electrode material according to Additional statement 1 for one of or each of a positive electrode and a negative electrode.
(Additional Statement 3)

An electric double-layer capacitor which uses the electrode material according to Additional statement 1 as an electrode.
(Additional Statement 4)

A filter for filtration including an aluminum structure obtained by the present invention.
(Additional Statement 5)

A catalyst support in which a catalyst is carried on the surface of an aluminum structure obtained by the present invention.
Industrial Applicability As described above, according to the present invention, since porous aluminum structures can be obtained, the present invention can be widely applied to cases where characteristics of aluminum are utilized, for example, in electric materials such as electrodes for batteries, various filters for filtration, catalyst supports, and the like.

REFERENCE SIGNS LIST 1 foamed resin 2 conductive layer 3 aluminum plating layer
4 cavity
21a, 21b plating tank 22 strip-shaped resin 23, 28 plating bath
   24 cylindrical electrode
25, 27 positive electrode 26 electrode roller
121 positive electrode 122 negative electrode 123 separator
   124 pressure plate
125 spring 126 pressing member 127 case 128 positive electrode terminal
129 negative electrode terminal 130 lead
141 polarizable electrode 142 separator 143 organic electrolytic solution
144 lead 145 case

What is claimed is:
1. A method of producing an aluminum structure comprising:
   a step of preparing an aluminum-coated resin molded body in which an aluminum layer is formed, directly or with another layer therebetween, on a surface of a resin molded body composed of urethane; and
   a step of decomposing the resin molded body by bringing the aluminum-coated resin molded body into contact with concentrated nitric acid with a concentration of 62% or more.

2. The method of producing an aluminum structure according to claim 1, wherein the resin molded body is a resin porous body having a three-dimensional network structure.

3. The method of producing an aluminum structure according to claim 1, further comprising, after the step of decomposing the resin molded body by bringing the aluminum-coated resin molded body into contact with concentrated nitric acid, a step of performing heat treatment in an inert atmosphere at 200° C. to 400° C.

4. The method of producing an aluminum structure according to claim 1, further comprising, after the step of decomposing the resin molded body by bringing the aluminum-coated resin molded body into contact with concentrated nitric acid, a solvent treatment step in which the aluminum structure is brought into contact with an organic solvent to remove a decomposition product of the resin molded body.

5. The method of producing an aluminum structure according to claim 1, wherein the step of preparing an aluminum-coated resin molded body includes a conductivity-imparting step in which electrical conductivity is imparted to the surface of the resin molded body and a step of forming an aluminum layer by performing aluminum plating in a molten salt.

6. The method of producing an aluminum structure according to claim 5, wherein the conductivity-imparting step is a step of attaching aluminum to the surface of the resin molded body by a vapor-phase method.

7. The method of producing an aluminum structure according to claim 5, wherein the conductivity-imparting step is a step of attaching one or more metals selected from the group consisting of nickel, copper, cobalt, and iron by electroless plating to the surface of the resin molded body.

* * * * *